United States Patent [19]
Mizutani et al.

[11] Patent Number: 5,616,944
[45] Date of Patent: Apr. 1, 1997

[54] DIODE AND SEMICONDUCTOR DEVICE HAVING A CONTROLLED INTRINSIC OR LOW IMPURITY CONCENTRATION REGION BETWEEN OPPOSITE CONDUCTIVITY TYPE SEMICONDUCTOR REGIONS

[75] Inventors: Hidemasa Mizutani, Sagamihara; Toru Koizumi, Machida, both of Japan

[73] Assignee: Canon Kabushiki Kaisha, Tokyo, Japan

[21] Appl. No.: 348,198

[22] Filed: Nov. 28, 1994

Related U.S. Application Data

[63] Continuation of Ser. No. 24,106, Feb. 23, 1993, abandoned, which is a continuation of Ser. No. 702,377, May 20, 1991, abandoned.

[30] Foreign Application Priority Data

May 21, 1990 [JP] Japan ..................... 2-129304

[51] Int. Cl.$^6$ ............ H01L 29/76; H01L 29/94; H01L 31/075; H01L 31/105
[52] U.S. Cl. .......... 257/365; 257/347; 257/350; 257/366; 257/656
[58] Field of Search ............ 357/58; 257/656, 257/350, 365, 366, 655, 657, 347

[56] References Cited

U.S. PATENT DOCUMENTS

| | | | |
|---|---|---|---|
| 4,037,140 | 7/1977 | Eaton | 361/16 |
| 5,140,391 | 8/1992 | Hayashi et al. | |

FOREIGN PATENT DOCUMENTS

| | | | |
|---|---|---|---|
| 2382097 | 9/1978 | France | 357/58 |
| 2490874 | 3/1982 | France | |
| 1025994 | 3/1958 | Germany | 357/58 |
| 57-184251 | 2/1983 | Japan | H01L 29/72 |
| 58-96766 | 6/1983 | Japan | |
| 58-096766 | 6/1983 | Japan | H01L 29/78 |
| 60-80279 | 5/1985 | Japan | |
| 60-245168 | 12/1985 | Japan | |
| 2086652 | 5/1982 | United Kingdom | |

OTHER PUBLICATIONS

Bogun et al "Tunable Oscillator Based on a PIN zinc–doped Silicon Diode" Sov. Phys. Semicond vol. 14, No. 6, Jun. 1980 pp. 724–726.

Primary Examiner—Ngân V. Ngô
Attorney, Agent, or Firm—Fitzpatrick, Cella, Harper & Scinto

[57] ABSTRACT

A diode is provided comprising first and second semiconductor regions. The first semiconductor region is of one conductivity type and the second is of the opposite conductivity type. A third region is provided which is either an intrinsic semiconductor region or a low concentration region. The low concentration region has an impurity concentration lower than that of the first and second semiconductor layers. The third region is arranged to separate the first and second semiconductor regions. A control electrode region is provided over the third region through an insulative film.

11 Claims, 4 Drawing Sheets

DIODE AND SEMICONDUCTOR DEVICE HAVING A CONTROLLED INTRINSIC OR LOW IMPURITY CONCENTRATION REGION BETWEEN OPPOSITE CONDUCTIVITY TYPE SEMICONDUCTOR REGIONS

This application is a continuation of application Ser. No. 08/024,106 filed Feb. 23, 1993, now abandoned, which was a continuation of application Ser. No. 07/702,377, filed May 20, 1991, now abandoned.

BACKGROUND OF THE INVENTION

1. Field of the Invention

The invention relates to a diode and a semiconductor device having such a diode and, more particularly, to a diode which is suitably used in a semiconductor integrated circuit or the like and to a semiconductor device having such a diode.

2. Related Background Art

Generally, a diode used in an electronic circuit device is formed by a PN junction of a semiconductor and is used as various circuit constructing devices taking advantage of its rectifying characteristic, breakdown voltage characteristic, and the like.

In such a diode, an internal electric field distribution is determined by an impurity profile of the PN junction. The characteristics of the breakdown voltage and the like are determined by the internal electric field distribution. Therefore, in general, by controlling the impurity profile of the PN junction, desired electrical characteristics are obtained.

However, various characteristics are required for a diode. When only the impurity profile of the PN junction is controlled, it is difficult to form a diode having the required characteristics.

For instance, it is possible to form a diode having a low capacity and a high processing speed, due to a high operating frequency, by controlling the impurity profile of the PN junction. It is also possible to form a diode such as an ordinary Zener diode which is used as a device for a constant voltage source circuit by using the breakdown voltage as a reference.

There is a method of reducing a capacity of the diode in order to accomplish a high-speed operating frequency. Practically speaking, a low concentration layer is sandwiched between high concentration layers of PN, thereby substantially widening a depletion layer and realizing a field relaxation. According to the above method, however, although a low capacity can be realized, a withstanding voltage rises, so that such a diode cannot be used as a low constant voltage source.

On the other hand, even in the case where a diode is used in a limited application field such as a diode for a high-speed operating frequency or a diode for a constant voltage, in order to form diodes for a plurality of application fields in the same chip, it is necessary to change the impurity profile of the PN junction in every diode. Therefore, manufacturing steps for such diodes become very complicated and it is difficult to suppress a variation of processing conditions.

As mentioned above, when only the impurity profile of the PN junction is controlled, it is difficult to manufacture a diode having both of the characteristics (diode which has a high operating speed and is used as a constant voltage source).

SUMMARY OF THE INVENTION

The invention is made in consideration of the problems as mentioned above and it is an object of the invention to provide a diode having an excellent operating frequency characteristic and an excellent characteristic such that the diode can be used for a constant voltage circuit and also to provide a semiconductor device having such a diode.

Another object of the invention is to provide a diode such that by using the diode in an electronic circuit device or a semiconductor device in which diodes for a plurality of application fields are formed in the same chip, a plurality of characteristics are obtained by a single diode, so that the number of diodes can be reduced and a circuit design can be simplified. Thus the costs can be reduced.

Still another object of the invention is to provide a diode which can be formed by ordinary MOS transistor manufacturing processes without increasing the number of manufacturing processes when an integrated circuit device is formed. Thus, it is also extremely advantageous in terms of the manufacturing costs. Also a semiconductor device is provided having such a diode.

Further another object of the invention is to provide a diode having a control electrode in which by floating the control electrode or by changing a potential of the control electrode, an internal electric field distribution of the diode is controlled. Thus, characteristics of the diode can be changed. Also a semiconductor device can be provided having such a diode.

Further another object of the invention is to provide a diode in which a first semiconductor region of one conductivity type and a second semiconductor region of a conductivity type opposite to that of the first semiconductor region are joined through an intrinsic semiconductor region or a low concentration impurity semiconductor region. A control electrode is provided for the intrinsic semiconductor region or the low concentration impurity region through an insulative film. Also a semiconductor device is provided having such a diode.

DETAILED DESCRIPTION OF THE PREFERRED EMBODIMENTS

A semiconductor device, especially, a diode according to the invention has a control electrode. Characteristics of the diode can be changed by controlling an internal electric field distribution by floating the control electrode or by changing the potential of the control electrode.

Figure 5A:
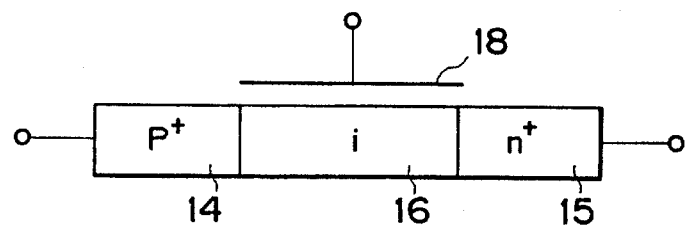
FIGS. 5A to 5C are explanatory diagrams for explaining an operating principle of the diode according to the invention, respectively.

A construction of the diode according to the invention is schematically shown in FIG. 5A. That is, in the diode according to the invention, a PN junction is not merely formed but an intrinsic or low concentration impurity semiconductor region (intrinsic semiconductor region in the diagram) 16 is formed between a first semiconductor region of one conductivity type ($p^+$ type region in the diagram) 14 and a second semiconductor region of a conductivity type ($n^+$ type region in the diagram) 15 opposite to the conductivity type of the first semiconductor region 14. A control electrode 18 is provided for the intrinsic or low concentration impurity semiconductor region 16.

Each of the first and second semiconductor regions 14 and 15 contains a material to control the conductivity type having a high concentration. A concentration of the material is set to a value which is equal to or larger than a concentration such as to obtain an ohmic contact between the electrode and the semiconductor region which are formed. Generally, a concentration of $10^{19}$ cm$^{-3}$ or more is preferable. A concentration of the material which is contained in the semiconductor region 16 and controls the conductivity type is set to either one of the case where none of the material to control the conductivity type is contained, the case where one of the materials which controls the conductivity type to the p type and the material which controls it to the n type is contained, and the case where both of the materials which controls the conductivity type to the p type and the material which controls it to the n type are contained and there is no difference or a small difference between the concentrations of those materials.

Atoms selected from the atoms which belong to the III and V groups of the periodic table are used as materials to control the conductivity type. For instance, B, Ga, P, As, etc. are preferably selected.

If the diode according to the invention is constructed as mentioned above, by floating the control electrode 18 or by changing a potential of the control electrode 18, an internal electric field distribution of the diode is controlled and the characteristics of the diode can be changed.

Figure 7:
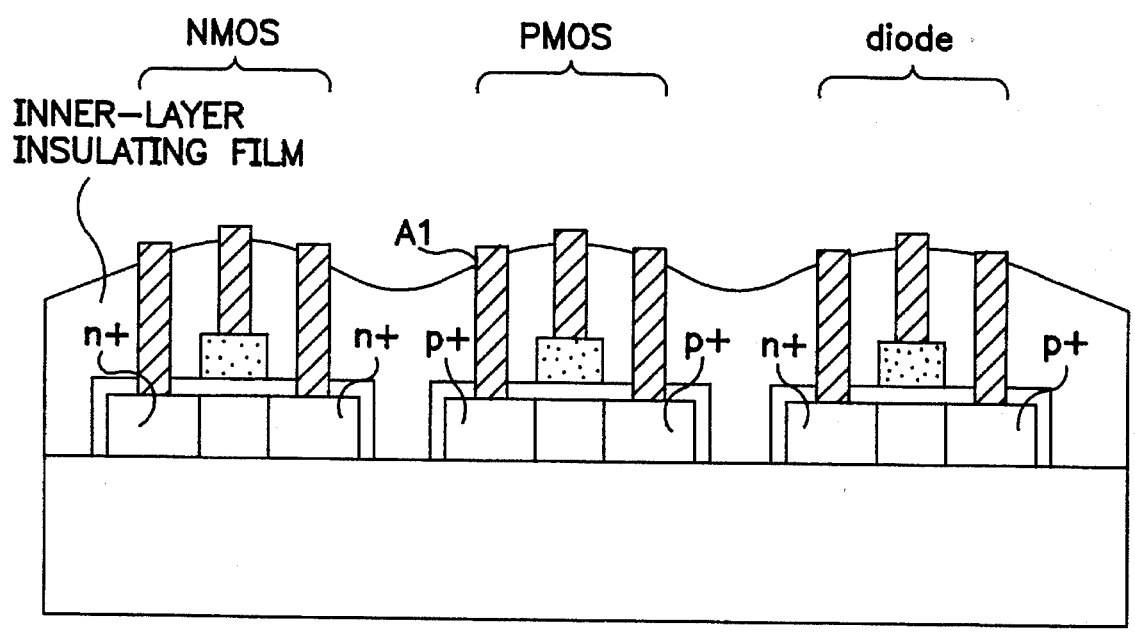
FIG. 7 is a sectional view for showing a MOS transistor.

Or, if the invention is applied to an electronic circuit device or a semiconductor device in which diodes for a plurality of application fields are formed in the same chip, such as the NMOS and PMOS devices shown in FIG. 7 a plurality of characteristics can be derived by a single diode. Therefore, the number of diodes can be reduced, the circuit design can be simplified. Thus, the costs can be reduced. Moreover, according to the manufacturing processes of the invention, the diode can be manufactured by ordinary MOS transistor manufacturing processes, so that an integrated circuit device can be manufactured without increasing the number of manufacturing processes. Additionally, the method of the invention is also extremely advantageous in terms of the manufacturing costs.

By forming the diode of the invention onto what is called an SOI (silicon on insulator) substrate, a potential of the whole film can be easily controlled by the control electrode, a depletion region is small, a dark current can be further reduced, and a parasitic capacitance of the device can be further decreased. Consequently, a higher withstanding voltage can be controlled and a high operating speed of the device can be realized (high frequency response speed can be improved).

According to the diode of the invention, in a region from an $n^+/p^+$ junction diode to an $n^+/i/p^+$ junction diode, the withstand voltage can be changed in accordance with a potential which is applied to the control electrode. Therefore, one diode can be individually used as one of a plurality of kinds of diodes or a diode having one structure can be used in correspondence to one of a plurality of diodes.

EMBODIMENTS

An embodiment of the invention will be described in detail hereinbelow with reference to the drawings.

Embodiment 1

Figure 1:
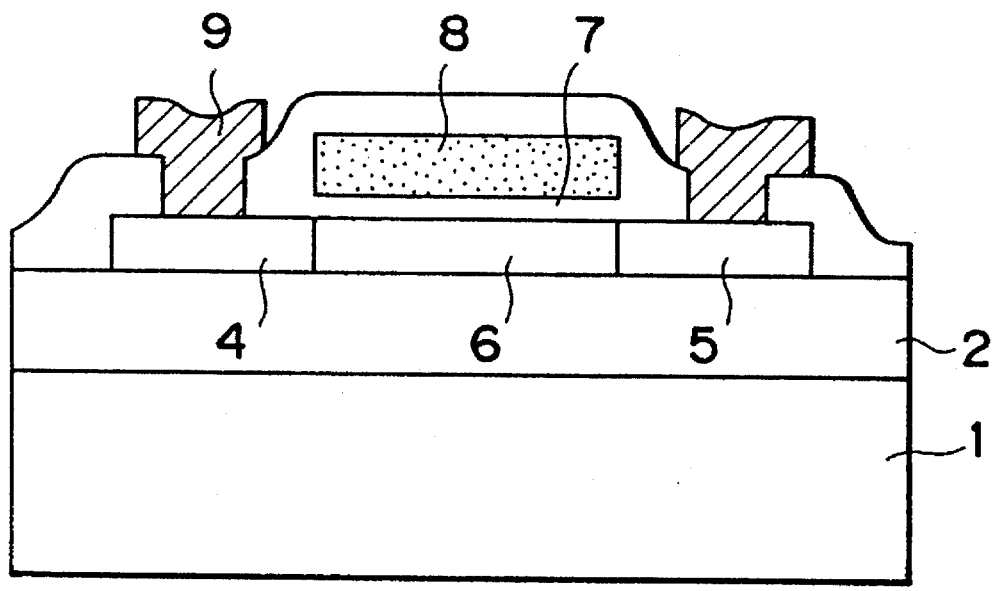
FIG. 1 is a schematic vertical sectional diagram for explaining a preferred embodiment of a diode according to the invention.

FIG. 1 is a schematic vertical sectional view for explaining a preferred embodiment of a diode of invention.

In the diagram, reference numeral 1 denotes an n type Si (100) substrate having a specific resistance of 100 Ω.cm; reference numeral 2 denotes a buried $SiO_2$ layer; reference numeral 4 denotes a p type high concentration impurity region (region containing impurities which can control the conductivity type to a p-type at a high concentration); reference numeral 5 denotes an n type high concentration impurity region (region containing impurities which can control the conductivity type to an n type at a high concentration); reference numeral 6 denotes an n type low concentration impurity region; reference numeral 7 denotes an oxide film; reference numeral 8 denotes an $n^+$ polysilicon electrode serving as a control electrode; and reference numeral 9 denotes an aluminum electrode.

Manufacturing steps of the above diode will be first described with reference to FIGS. 2 to 4.

Figure 2:
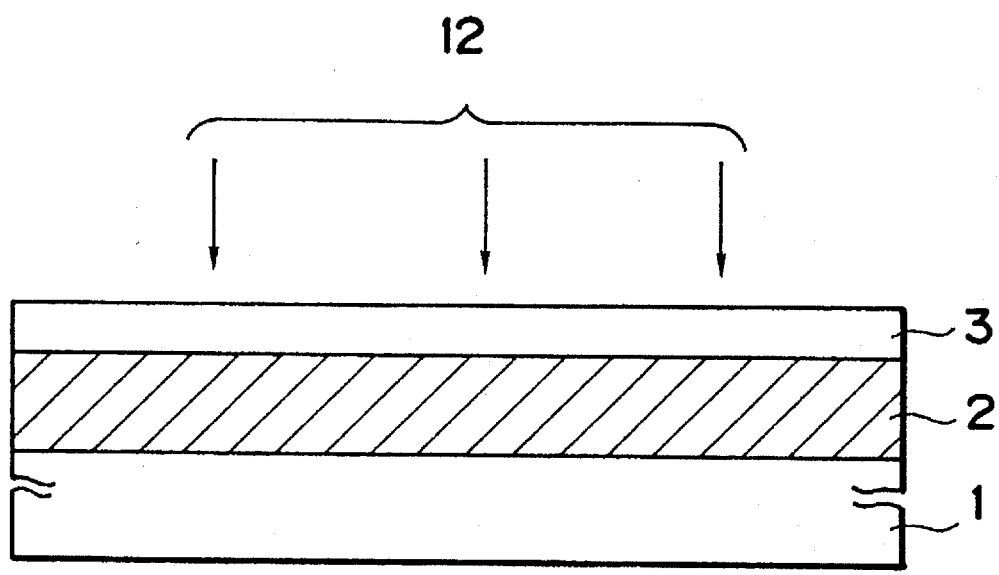
FIGS. 2 to 4 are schematic vertical sectional diagrams for explaining manufacturing steps of the diode shown in FIG. 1, respectively.
Figure 3:
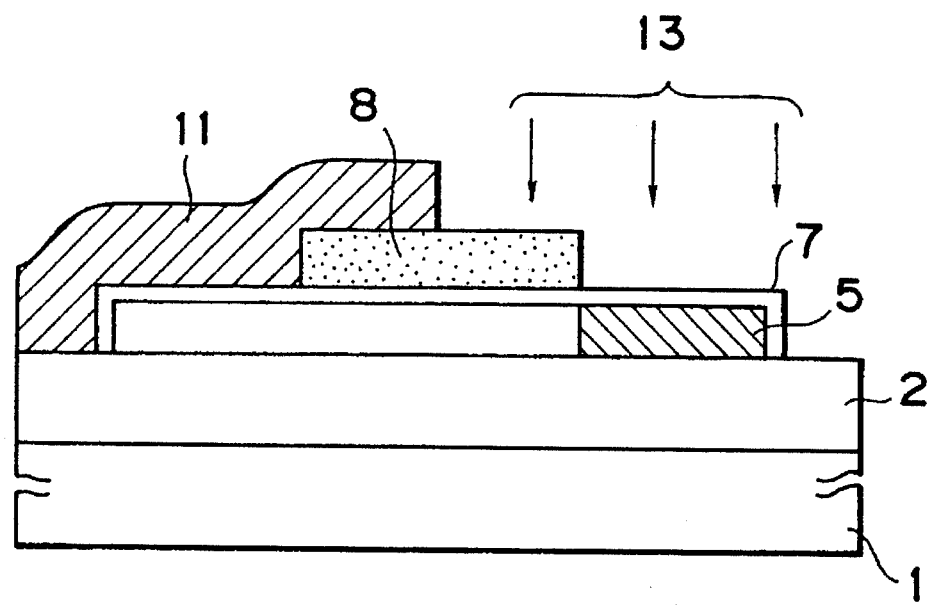
Figure 4:
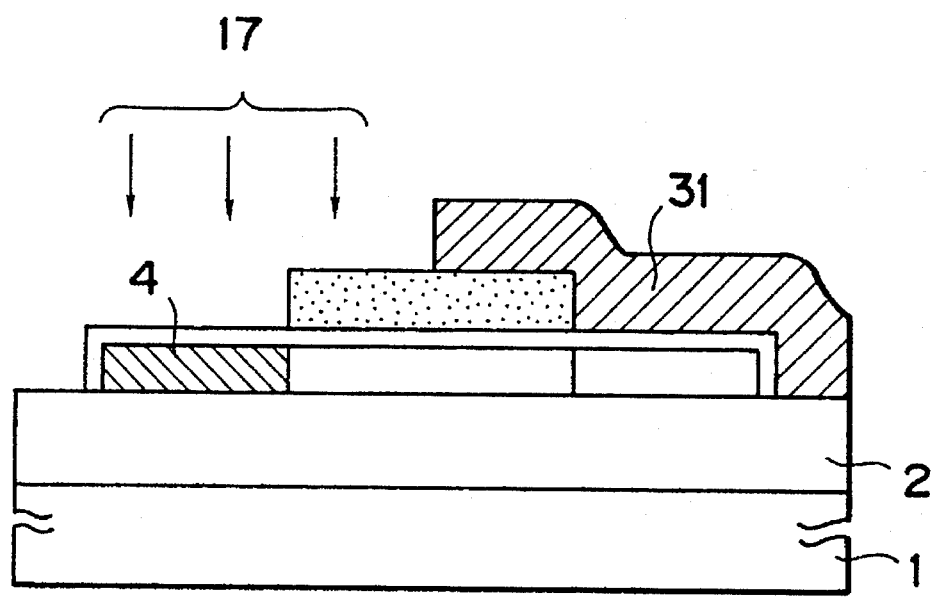

FIGS. 2 to 4 are schematic vertical sectional views for explaining the manufacturing steps of the diode shown in FIG. 1, respectively.

First, as shown in FIG. 2, the n type Si (100) substrate having the specific resistance of 100 Ω.cm is heated to a temperature of 600° C. and oxygen ions 12 having a dose amount of $1.8 \times 10^{18}$/cm$^2$ are implanted into the substrate at 200 keV. After that, the substrate is annealed at 1300° C. for six hours. Thus, an n type monocrystalline layer 3 having a thickness of 2200 Å is formed on the buried $SiO_2$ layer 2 having a thickness of 3700 Å. The SIMOX (separation by Implantation of Oxygen) substrate is wet-oxidized under the conditions of 1000° C. and 30 minutes. After that, the oxide film on the surface is eliminated by using hydrofluoric acid, thereby reducing the thickness of the n type monocrystalline layer 3 to about 1000 Å.

A reason why the whole region of the n type monocrystalline layer is the substrate is because with respect to an ultrathin film SOI device (CMOS transistor here) which is simultaneously formed on the same substrate as well, by making a thickness of the semiconductor layer thinner than the maximum thickness of the depletion layer, a mobility can be increased by a vertical field relaxation.

Then, as shown in FIG. 3, after the semiconductor layer was etched to separate the device, the oxide film 7 having a thickness of 500 Å is formed by a thermal oxidation, thereby forming the $n^+$ polysilicon electrode 8 having a width of 6 μm onto the oxide film 7. At this time, with respect to the SOI type CMOS transistor (not shown) which is simultaneously formed on the same substrate as well, the device separation is executed by etching and a gate oxide film and a gate electrode are formed.

After that, phosphorus (P) ions 13 are implanted through a resist mask 11 into a part of the n type monocrystalline layer 3 having a concentration of $1 \times 10^{15}$ cm$^{-2}$ and at 60 keV, thereby forming the n type high concentration impurity region 5.

At this time, impurities are also simultaneously implanted to form a source region and a drain region of an NMOS transistor of the CMOS transistor.

As shown in FIG. 4, boron (B) ions 17 are subsequently implanted through a resist mask 31 into a region different from the foregoing region of the n type monocrystalline layer 3 having a concentration of $1\times10^{15}$ cm$^{-2}$ and at 20 keV, thereby forming the p type high concentration impurity region 4.

At this time, impurities are also simultaneously implanted to form a source region and a drain region of PMOS transistor of the CMOS transistor.

Annealing is executed to activate the high concentration impurity regions 4 and 5, thereby forming a high concentration impurity layer of about $10^{20}$ cm$^{-3}$. At this time, annealing is also simultaneously executed to activate the impurities in the source and drain regions of the NMOS transistor and the PMOS transistor.

By ohmically connecting the aluminum electrodes 9 to the high concentration impurity regions 4 and 5, the diode as shown in FIG. 1 is formed. As shown in FIG. 1, the low concentration impurity region 6 is externally diffused by annealing at a high temperature of 1300° C. for six hours and is set to a concentration of about $10^{13}$ cm$^{-3}$. Region 6 is in a state which is almost near the intrinsic state as compared with the first substrate concentration. The low concentration impurity region 6 is floating with regard to the potential.

The operation principle of the above diode will now be described with reference to FIGS. 5A to 5C.

Figure 5B:
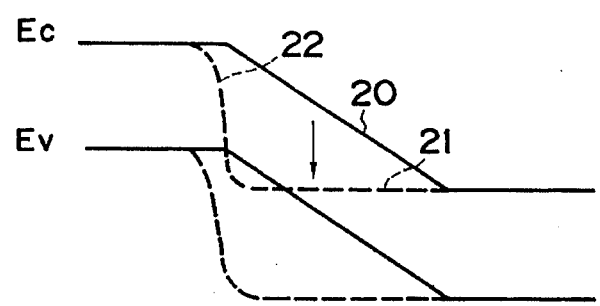
Figure 5C:
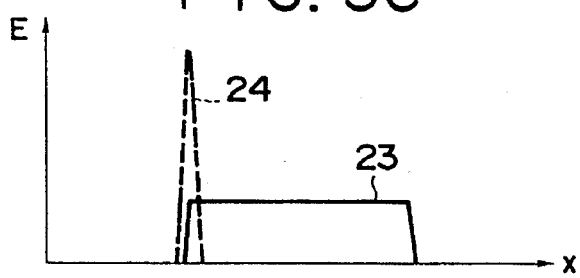

In FIG. 5A, in the case where the p$^+$ type region 14 is connected to the ground potential of 0 V and a predetermined voltage is applied to the n$^+$ type region 15, the potential smoothly changes in the low concentration region as shown by a line 20 in FIG. 5B so long as the control electrode 18 is floating. This is because the depletion layer spreads into the whole low concentration impurity region having a width of 6 μm and a uniform electric field is applied as shown by a line 23 in FIG. 5C. In such a state, the diode has a very low capacitance, a high response speed, and a high anti-bias withstanding voltage of 50 V or higher.

On the other hand, when a voltage of a threshold level or higher is applied to the control electrode 18, the potential of the low concentration impurity region 16 decreases as a whole because a film thickness of the semiconductor layer is thin. In a strongly inverted (i.e., due to a voltage applied by the control electrode 18), the low impurity concentration region 16 becomes an n type like area portion in the low impurity concentration region 16, as shown by a broken line 21 in FIG. 5B, the potential of the region 16 approaches the potential of the n type high concentration impurity region 15. Thus, an inversely biased potential suddenly changes at a boundary between the p type high concentration impurity region 14 and the low concentration impurity region 16 as shown by a broken line 22 in FIG. 5B. Therefore, as shown by a broken line 24 in FIG. 5C, a high field concentration occurs at a boundary between the p type high concentration impurity region 14 and the low concentration impurity region 16 and a breakdown voltage suddenly drops.

In the embodiment, the breakdown voltage is equal to about 5.5 V and the diode can be used as a Zener diode for a constant voltage.

Although the operation has been described on the assumption that the control electrode 18 is floating for simplicity of explanation, even if the potential is equal to 0 V, a band profile is merely slightly changed and there is no essential difference.

According to the diode of the embodiment described above, the diode characteristics can be continuously changed by a voltage which is applied to the control electrode.

Embodiment 2

Figure 6:
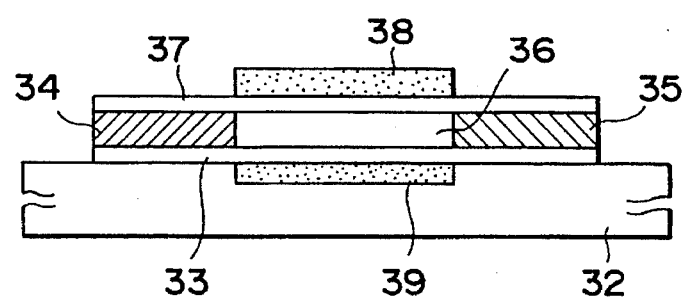
FIG. 6 is a vertical sectional view for explaining another preferred embodiment of a diode according to the invention.

FIG. 6 is a schematic vertical sectional view of another preferred embodiment of a diode according to the invention.

In the embodiment, a lower control electrode 39 is formed together with an upper control electrode 38, thereby forming a double-gate structure.

In the diagram, reference numeral 34 denotes a p type high concentration impurity region of boron having a concentration of $10^{20}$ cm$^{-3}$; reference numeral 36 denotes an n type low concentration impurity region of phosphorus having a concentration of $10^-$cm$^{-3}$; reference numeral 35 denotes an n type high concentration impurity region of phosphorus having a concentration of $10^{20}$ cm$^{-3}$; reference numeral 32 denotes an insulative substrate; and reference numerals 33 and 37 denote insulative films each having a thickness of 300 Å. A thickness of each of the impurity regions is set to 500 Å. By forming such a very thin low concentration impurity region and by forming a double-gate electrode structure, a potential of the low concentration impurity region can be uniformly controlled for the entire semiconductor layer and the stability of the characteristics can be improved.

What is claimed is:

1. A diode comprising:

an insulating substrate;

a first control electrode provided on said insulating substrate;

a first insulating layer provided on said first control electrode;

a semiconductor layer extending beyond an area over said first control electrode on said insulating substrate, said semiconductor layer comprising a first semiconductor region of a first conductivity type, a second semiconductor region of a conductivity type opposite to the first conductivity type, and a third semiconductor region formed of one of an intrinsic region and an impurity region which has an impurity concentration lower than impurity concentrations of said first and second semiconductor regions, said third semiconductor region being arranged to oppose said first control electrode;

a second insulating layer formed at least on said third semiconductor region; and a second control electrode arranged correspondingly to said third semiconductor region and separated from said third semiconductor region by said second insulating layer, said third semiconductor region being sandwiched between said first and second control electrodes, wherein said first and second semiconductor regions are each adjacent to said third semiconductor region, said first and second semiconductor regions each having an impurity concentration not less than $10^{19}$ cm$^{-3}$, said third semiconductor region having an impurity concentration not greater than $10^{14}$ cm$^{-3}$, and said semiconductor layer having a thickness less than a maximum thickness of a depletion region, so that in said first and second semiconductor regions, (a) the depletion region extends to said third semiconductor region at a floating state of said second control electrode, and (b) the depletion region extends into a whole of said third semiconductor region at a driving state of said second control electrode.

2. A diode according to claim 1, wherein said first semiconductor region and said second semiconductor region include an impurity of a high concentration within a range having an upper limit of an order of $10^{20}$ cm$^{-3}$ for controlling conductivity type, in order to form an ohmic contact to electrodes connected to said first and second semiconductor regions.

3. A diode according to claim 1, wherein said insulating substrate has at least an insulating surface.

4. A diode according to claim 1, wherein the impurity included in said first semiconductor region for controlling the conductivity type is, at least, one atom selected from the group consisting of periodic table element groups III and V.

5. A diode according to claim 1, wherein said first, second and third semiconductor regions each comprise monocrystalline silicon.

6. A diode according to claim 1, wherein the impurity included in said second semiconductor region for controlling the conductivity type therein is, at least, one element selected from groups III and V of the periodic table.

7. A diode according to claim 1, wherein the impurity included in said third semiconductor region is, at least, one element selected from groups III and V of the periodic table.

8. A diode according to claim 1, wherein the impurity included in said first semiconductor region for controlling the conductivity therein is at least one element selected from groups III and V of the periodic table, and the impurity included in said third semiconductor region is the same element included in said first semiconductor region and selected from the groups III and V.

9. A diode according to claim 1, wherein the impurity included in said second semiconductor region for controlling the conductivity therein is at least one element selected from groups III and V of the periodic table, and the impurity included in said third semiconductor region is the same element included in said second semiconductor region selected from groups III and V.

10. A diode according to claim 1, wherein the impurity included in said first semiconductor region for controlling the conductivity type therein is at least one element selected from groups III and V of the periodic table, and the impurity included in said second semiconductor region for controlling the conductivity type therein is at least one element selected from a group different from groups III and V.

11. A semiconductor device comprising a MOS transistor and a diode on a common insulating substrate, said diode comprising:

a first control electrode provided on said common insulating substrate;

an first insulating layer provided on said first control electrode;

a semiconductor layer extending beyond an area over said first control electrode on said insulating substrate, said semiconductor layer comprising a first semiconductor region of a first conductivity type, a second semiconductor region of a conductivity type opposite to the first conductivity type, and a third semiconductor region formed of one of an intrinsic region and an impurity region which has an impurity concentration lower than impurity concentrations of said first and second semiconductor regions, said third semiconductor region being arranged to oppose said first control electrode;

a second insulating layer formed at least on said third semiconductor region; and a second control electrode arranged correspondingly to said third semiconductor region and separated from said third semiconductor region by said second insulating layer, said third semiconductor region being sandwiched between said first and second control electrodes, wherein said first and second semiconductor regions are each adjacent to said third semiconductor region, said first and second semiconductor regions each having an impurity concentration not less than $10^{19}$ cm$^{-3}$, said third semiconductor region having an impurity concentration not greater than $10^{14}$ cm$^{-3}$, and said semiconductor layer having a thickness less than a maximum thickness of a depletion region, so that in said first and second semiconductor regions, (a) the depletion region extends to said third semiconductor region at a floating state of said second control electrode, and (b) the depletion region extends into a whole of said third semiconductor region at a driving state of said second control electrode.

* * * * *